United States Patent
Liao et al.

(10) Patent No.: US 9,210,828 B2
(45) Date of Patent: Dec. 8, 2015

(54) POWER SUPPLY DEVICE STRUCTURE

(71) Applicant: DELTA ELECTRONICS, INC., Taoyuan County (TW)

(72) Inventors: Shih-Ching Liao, Taoyuan County (TW); Hung-Chuan Chen, Taoyuan County (TW)

(73) Assignee: DELTA ELECTRONICS, INC. (TW)

( * ) Notice: Subject to any disclaimer, the term of this patent is extended or adjusted under 35 U.S.C. 154(b) by 81 days.

(21) Appl. No.: 14/280,980

(22) Filed: May 19, 2014

(65) Prior Publication Data

US 2015/0208544 A1  Jul. 23, 2015

(30) Foreign Application Priority Data

Jan. 23, 2014  (TW) .............. 103102400 A

(51) Int. Cl.
*H05K 7/14* (2006.01)
*H05K 5/02* (2006.01)

(52) U.S. Cl.
CPC .............. *H05K 7/1492* (2013.01); *H05K 5/023* (2013.01)

(58) Field of Classification Search
CPC .... H05L 7/1492; H05L 7/1415; H05L 7/1491
See application file for complete search history.

(56) References Cited

U.S. PATENT DOCUMENTS

| | | | | |
|---|---|---|---|---|
| 5,348,495 A * | 9/1994 | Kasden | .............. | H01R 13/6395 439/371 |
| 5,562,410 A * | 10/1996 | Sachs | .................. | F04D 29/601 361/695 |
| 6,316,718 B1 * | 11/2001 | Lin | .................... | H05K 7/20172 174/17 VA |
| 6,396,675 B1 * | 5/2002 | Su | .............................. | G06F 1/20 318/471 |
| 6,739,896 B2 * | 5/2004 | Sivertsen | ........... | H01R 13/6395 174/135 |
| 6,767,237 B1 * | 7/2004 | Shih | .................... | H01R 13/6392 439/371 |
| 7,134,902 B1 * | 11/2006 | Lewis | ................ | H01R 13/6395 439/372 |
| 7,199,491 B2 * | 4/2007 | Novinsky | ............. | H02B 11/173 307/328 |
| 7,241,163 B1 * | 7/2007 | Cox | ....................... | B01J 19/126 439/373 |
| 7,283,369 B2 * | 10/2007 | Chang | .................. | H05K 5/0208 200/330 |
| 7,429,701 B1 * | 9/2008 | Kushnir | ............. | H01R 13/6392 174/154 |
| 7,513,791 B1 * | 4/2009 | Gary | .................. | H01R 13/6395 439/373 |
| 7,613,006 B2 * | 11/2009 | Kuo | ...................... | G11B 33/123 174/520 |
| 7,722,380 B1 * | 5/2010 | West | .................. | H01R 13/6395 439/373 |

(Continued)

*Primary Examiner* — Hoa C Nguyen
*Assistant Examiner* — Xanthia C Cunningham
(74) *Attorney, Agent, or Firm* — Hauptman Ham, LLP

(57) ABSTRACT

A power supply device structure includes a casing with a front panel and an insertion port formed on the front panel, an elastic plate installed on an internal side of the casing, and a pull handle with an end pivoted to the casing by a first pivot and the other end pivoted to the movable end of the elastic plate by a second pivot. Both ends of the elastic plate are a fixed end and a movable end respectively, and the fixed end is disposed on an internal side of the casing, and the movable end is protruded from the front panel. A portion of the pull handle is bent into a U-shaped clamp portion which is corresponsive to the insertion port, and the pull handle is pivoted by the first and second pivots, such that the clamp portion is situated at an external side of the insertion port.

16 Claims, 7 Drawing Sheets

(56) References Cited

U.S. PATENT DOCUMENTS

| | | | | |
|---|---|---|---|---|
| 7,817,435 B2* | 10/2010 | Iwaasa | H05K 5/0247 | 174/520 |
| 7,850,478 B2* | 12/2010 | Lin | H01R 13/6395 | 439/372 |
| 8,134,074 B2* | 3/2012 | Ong | H05K 7/1421 | 174/135 |
| 8,248,820 B2* | 8/2012 | Wu | H05K 7/1492 | 361/730 |
| 8,456,845 B2* | 6/2013 | Liu | G06F 1/188 | 361/695 |
| 8,529,285 B1* | 9/2013 | Sievers | H01R 13/6395 | 439/373 |
| 8,611,099 B2* | 12/2013 | Sun | H05K 7/1489 | 361/725 |
| 8,683,656 B2* | 4/2014 | Mizuguchi | B62B 5/067 | 16/422 |
| 8,743,563 B2* | 6/2014 | Liang | G06F 1/188 | 361/802 |
| 8,749,973 B2* | 6/2014 | Nan | G06F 1/187 | 16/110.1 |
| 8,824,149 B2* | 9/2014 | Wang | G06F 1/188 | 361/272 |
| 8,847,085 B2* | 9/2014 | Chen | H02J 1/00 | 174/50 |
| 2002/0068477 A1* | 6/2002 | Chen-Chiang | H01R 13/6395 | 439/373 |
| 2012/0194350 A1* | 8/2012 | Crisp | H05K 7/1498 | 340/815.42 |
| 2012/0293975 A1* | 11/2012 | Liang | G06F 1/188 | 361/807 |
| 2013/0072070 A1* | 3/2013 | Tsai | H05K 7/1492 | 439/660 |
| 2013/0342979 A1* | 12/2013 | Chen | H02J 1/00 | 361/679.01 |
| 2014/0015386 A1* | 1/2014 | Liu | H05K 5/04 | 312/223.1 |
| 2014/0334110 A1* | 11/2014 | Nichols | H01R 31/08 | 361/729 |

* cited by examiner

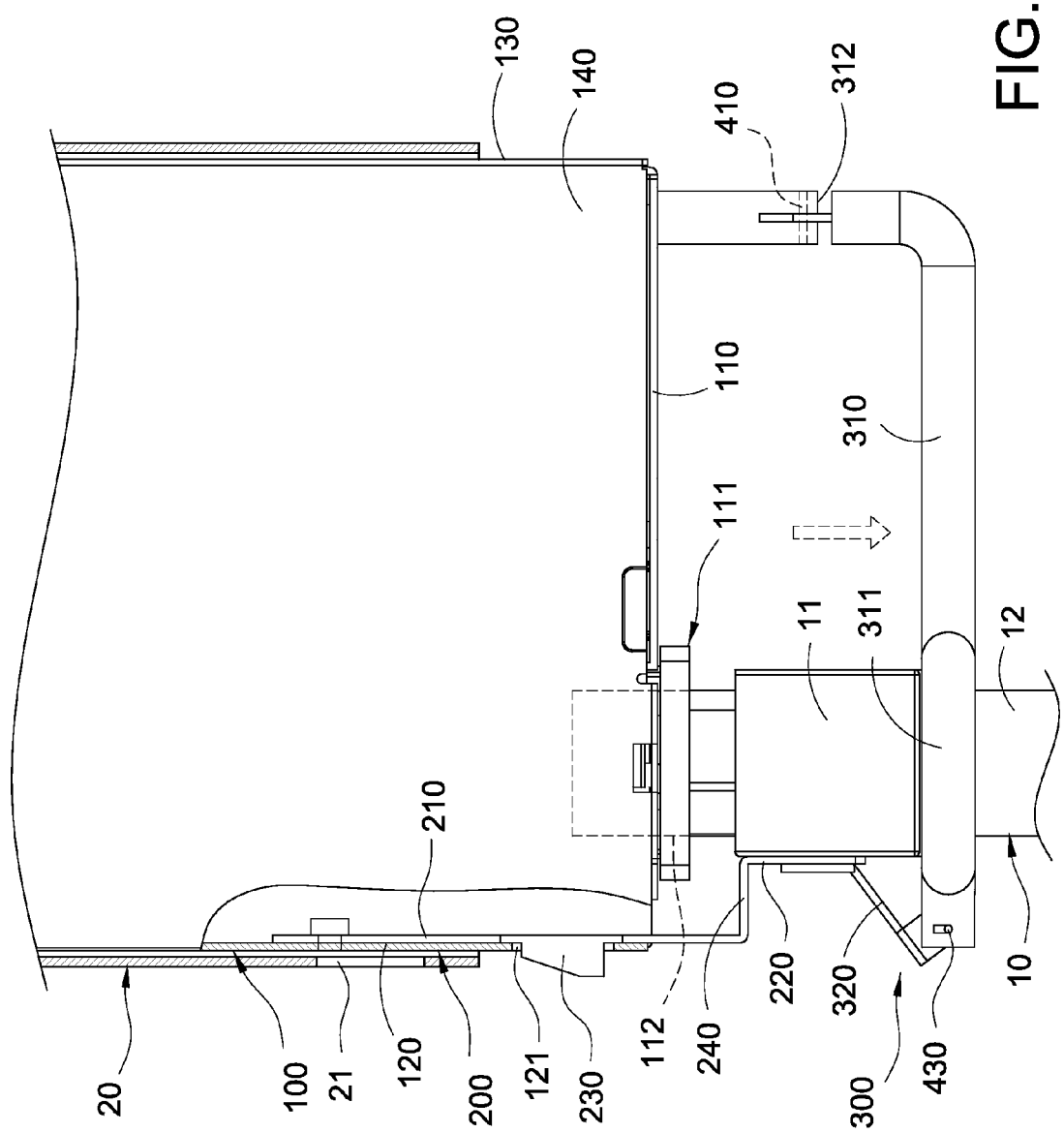

POWER SUPPLY DEVICE STRUCTURE

TECHNICAL FIELD

The present disclosure relates to a power supply device, particularly to a power supply device structure.

BACKGROUND

In general, most power supply devices installed in a server cabinet comes with a casing, and a fastener and a pull handle installed onto the casing. When the power supply device is installed in the cabinet, the fastener is fastened to an inner wall of the cabinet to fix the cabinet. The pull handle is provided for users to hold and pull the power supply device out from the cabinet.

In the manufacturing process of a conventional power supply device installed in a cabinet, it is necessary to prepare the fastener and pull handle separately, and the fastener and pull handle are assembled onto the casing. Therefore, the manufacturing procedure of the conventional power supply device installed in a cabinet becomes relatively more complicated. In addition, only the fastener is provided for fixing the power supply device in the cabinet, but there is no mechanism to prevent a plug plugged to the power supply device from falling out.

In view of the aforementioned problem, the inventor of the present disclosure based on years of experience in the related industry to conduct extensive researches and experiments, and finally designed a feasible solution to overcome the problem of the prior art.

BRIEF SUMMARY

Therefore, it is a primary objective of the present disclosure to overcome the drawbacks of the prior art by providing a power supply device structure capable of fixing a plug plugged onto a power supply device To achieve the aforementioned objective, the present disclosure provides a power supply device structure comprising a casing, an elastic plate and a pull handle. The casing includes a front panel, and an insertion port formed on the front panel. The elastic plate is installed on an internal side of the casing, and both ends of the elastic plate are a fixed end and a movable end respectively, and the fixed end is disposed on an internal side of the casing, and the movable end is protruded from the front panel. An end of the pull handle is pivoted to the casing by a first pivot, and the other end of the pull handle is pivoted to the movable end of the elastic plate by a second pivot, and a portion of the pull handle is bent into a U-shaped clamp portion. Wherein, the clamp portion is disposed at a position corresponding to the insertion port, and the pull handle can be pivoted by the first pivot and the second pivot, so that the clamp portion can be situated at an external side of the insertion port.

Preferably, the pull handle of the power supply device structure includes a crank lever and a connecting element, and an end of the crank lever is pivoted to the front panel by the first pivot, and the other end of the crank lever is pivoted to an end of the connecting element by a third pivot, and the other end of the connecting element is pivoted to the elastic plate by the second pivot.

Preferably, the clamp portion of the power supply device structure is formed on the crank lever.

Preferably, the connecting element of the power supply device structure is driven by the movable end of the elastic plate to pivot towards the crank lever by the third pivot, when the movable end of the elastic plate is pushed away from the casing.

Preferably, the casing of the power supply device structure includes a side panel perpendicularly coupled to the front panel, and the fixed end of the elastic plate has a hook, and the elastic plate is installed on the side panel by the hook.

Preferably, the side panel of the power supply device structure has a through hole formed thereon, and the hook of the elastic plate is disposed in the through hole.

Preferably, the pull handle of the power supply device structure is pivoted to the front panel by the first pivot or pivoted to another side panel which is perpendicularly coupled to the front panel.

Preferably, the pull handle of the power supply device structure is pivoted to by the front panel by the first pivot or pivotally coupled to a side panel which is perpendicularly coupled to the front panel.

Preferably, the side panel of the power supply device structure has a through hole formed thereon, and the hook of the elastic plate is disposed in the through hole.

Preferably, the fixed end of the elastic plate of the power supply device structure has a hook, and the casing has a through hole formed thereon and the hook of the elastic plate is disposed in the through hole.

Preferably, when the movable end of the elastic plate of the power supply device structure is pushed away from the casing, the hook is driven away from the through hole and retracted towards the interior of the casing.

Preferably, the movable end of the power supply device structure is aligned evenly with an edge of the insertion port.

Preferably, the pull handle of the power supply device structure is pivoted by the first pivot and the second pivot and situated between a releasing position and a locking position. When the pull handle is situated at the locking position, the clamp portion is situated at the front of the insertion port, and when the pull handle is situated at the releasing position, the position of the clamp portion is higher than the position of the insertion port.

Preferably, the pull handle of the power supply device structure has a stop portion disposed adjacent to the first pivot and provided for being abutted by the crank lever to limit the locking position.

Preferably, the elastic plate of the power supply device structure further includes a stop portion provided for being abutted by the connecting element to limit the locking position.

The power supply device structure of the present disclosure is a structure pivoted to the elastic plate by the pull handle to simplify the assembling procedure of the power supply device, and the pull handle is clamped and inserted into the plug of the power supply device. The power supply device structure of the present disclosure has the effect of fixing the plug. Compared with the prior art, the application of the present disclosure is safer. In addition, the power supply device structure of the disclosure does not require installing the fastener and the pull handle separately, so as to lower the assembling cost.

BRIEF DESCRIPTION OF THE DRAWINGS

FIG. 7 is another schematic view of a power supply device structure of the present disclosure plugged with an electric cable.

DESCRIPTION OF THE PREFERRED EMBODIMENTS

Figure 1:
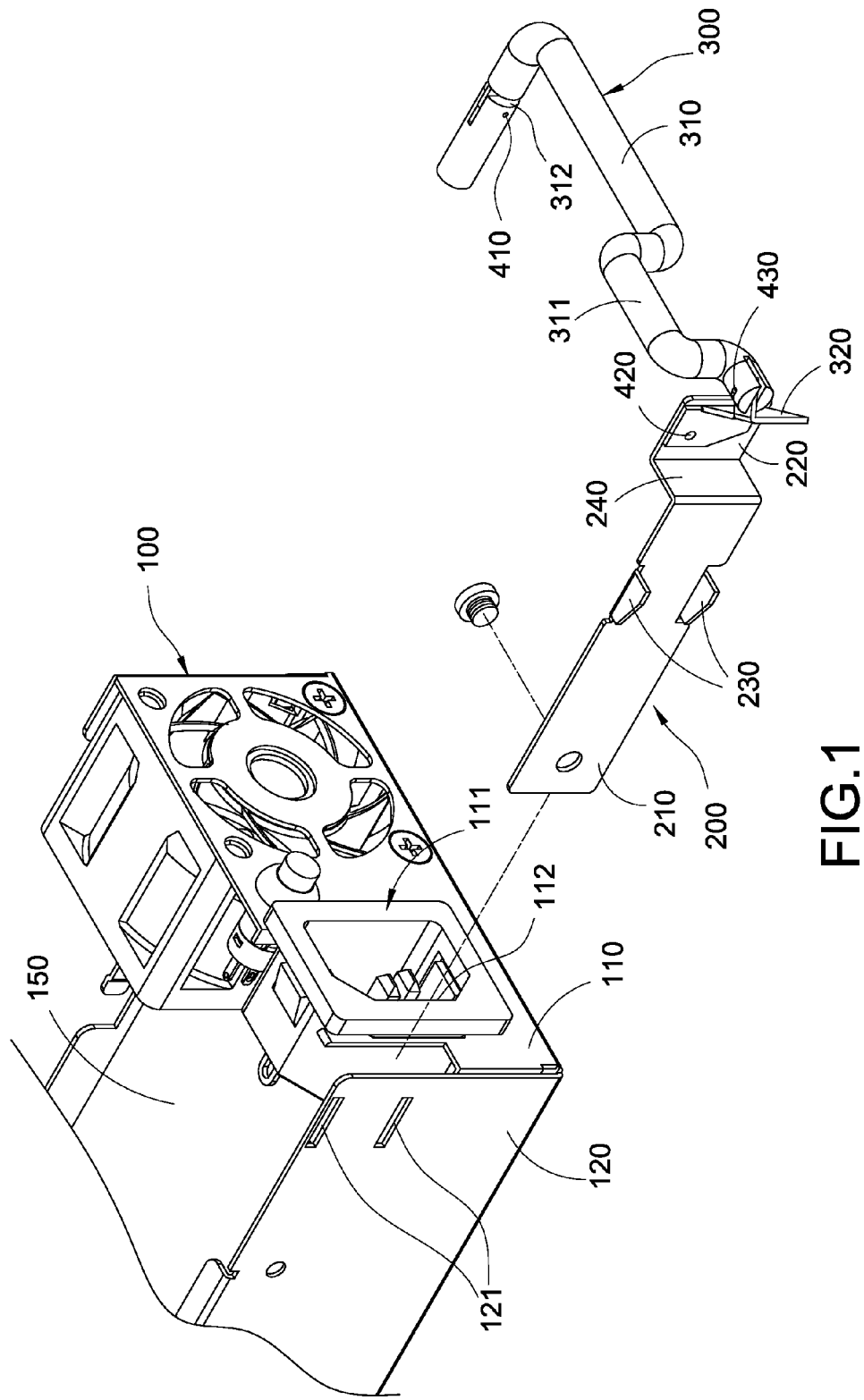
FIG. 1 is an exploded view of a power supply device structure of the present disclosure.

The technical contents of the present disclosure will become apparent with the detailed description of preferred embodiments accompanied with the illustration of related drawings as follows. It is noteworthy that same numerals are used for representing same respective elements in the drawings.

Figure 2:
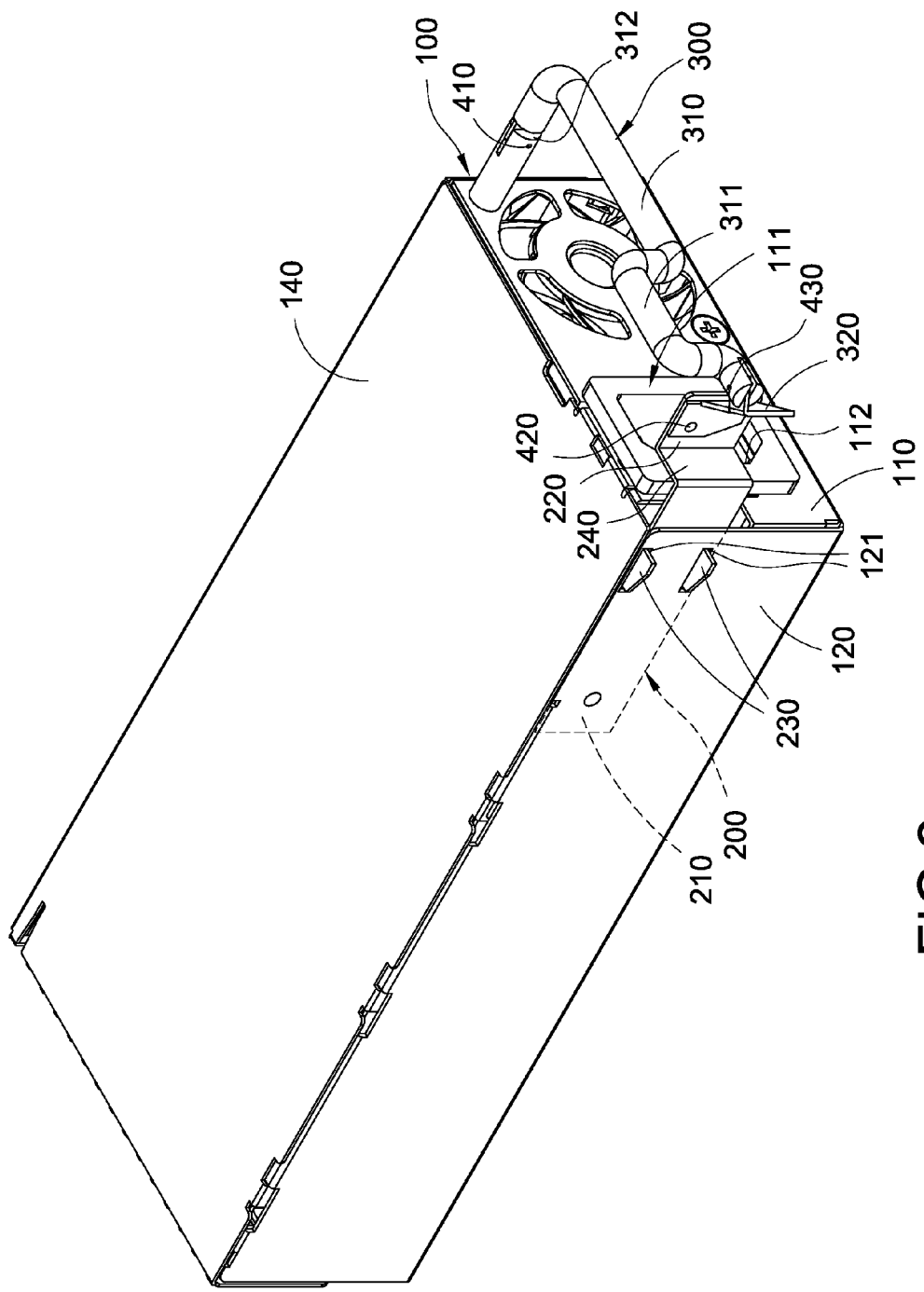
FIG. 2 is a perspective view of a power supply device structure of the present disclosure.

With reference to FIGS. 1 and 2 for a power supply device structure in accordance with a preferred embodiment of the present disclosure, the power supply device structure comprises a casing 100, an elastic plate 200, and a pull handle 300.

Figure 3:
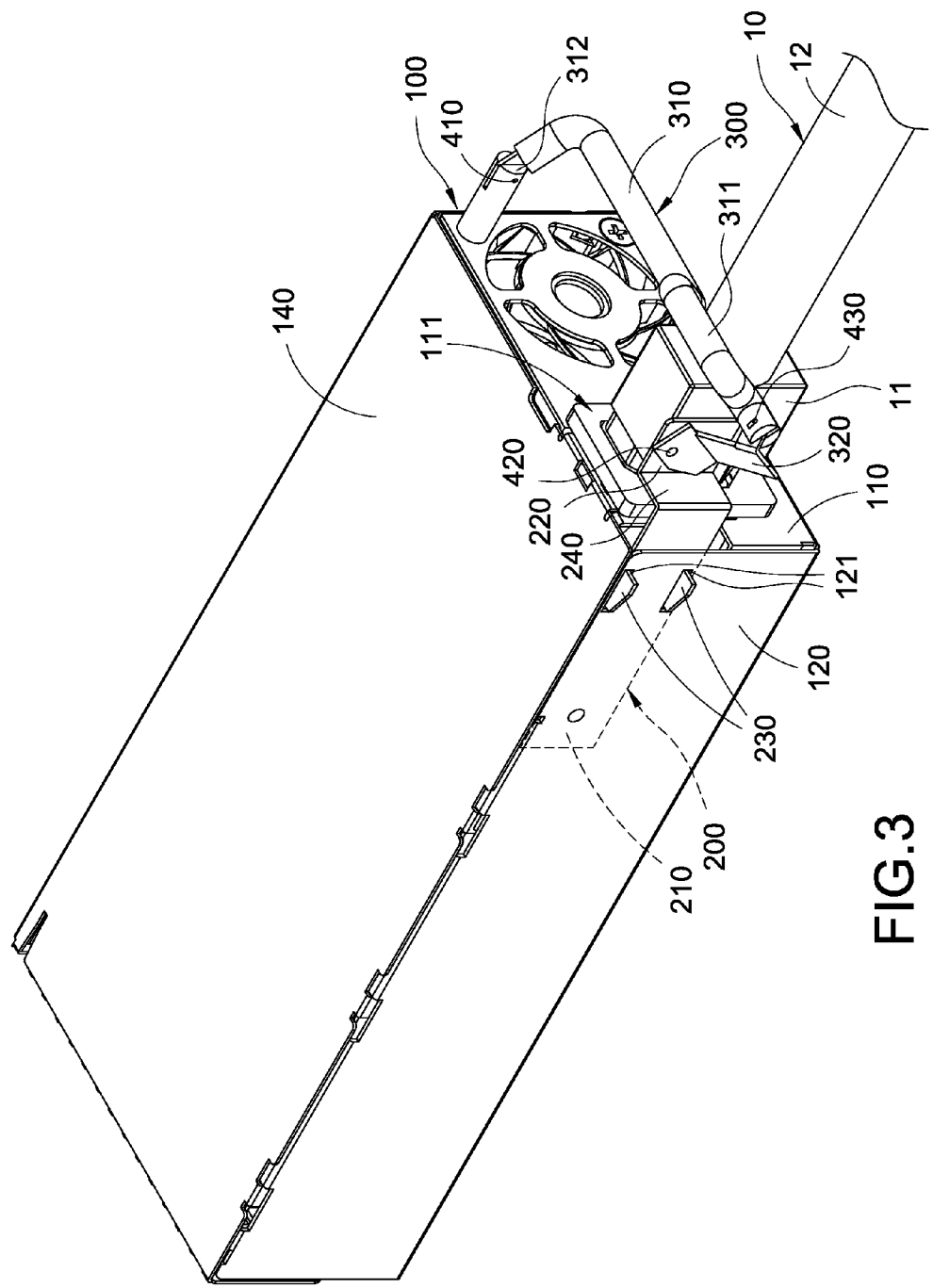
FIG. 3 is a perspective view of a power supply device structure of the present disclosure plugged with an electric cable.

In FIG. 3, the power supply device of the present disclosure is provided and plugged with an electric cable 10, and the electric cable 10 comprises a plug 11 and a conductive wire 12 coupled to the plug 11.

Figure 5:
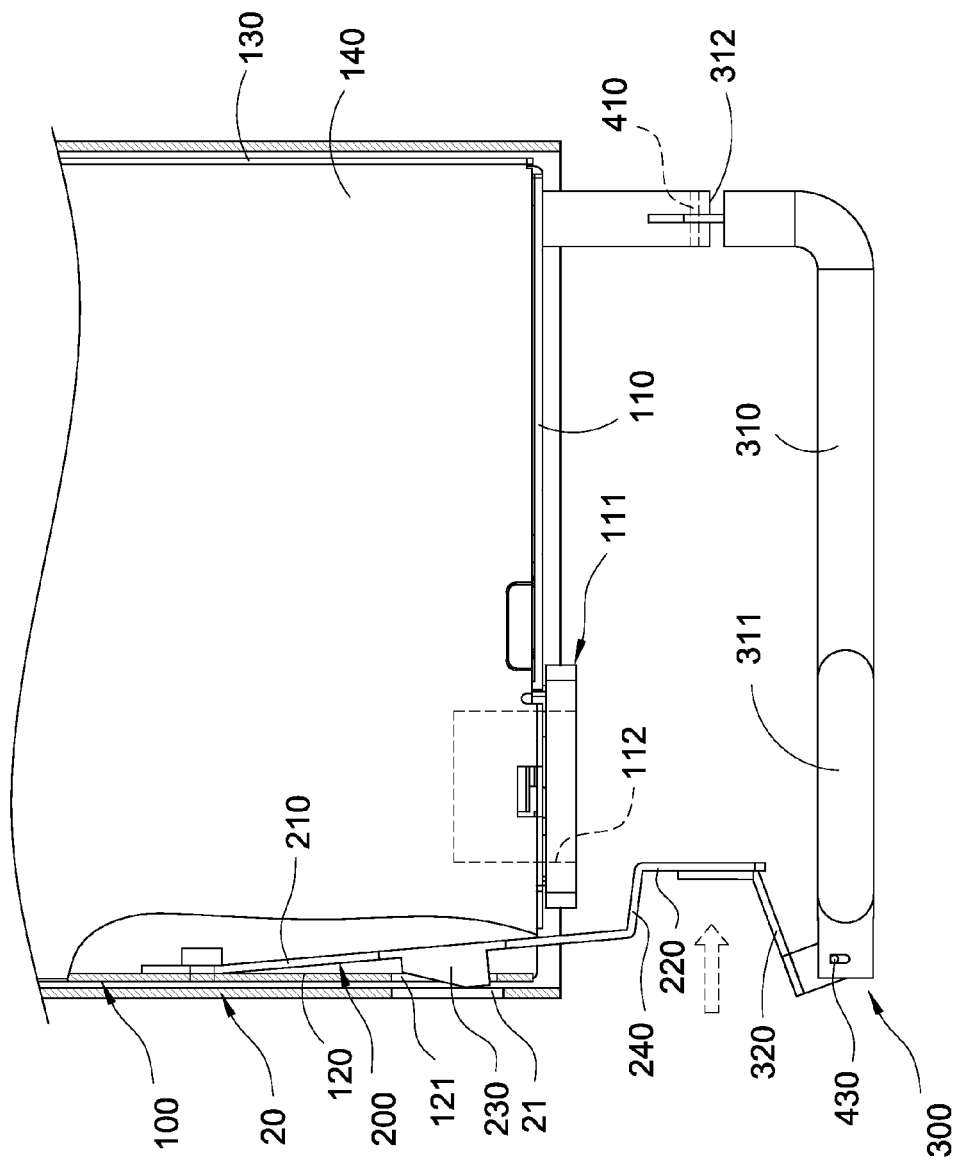
FIG. 5 is a schematic view of an operation of an elastic plate in a power supply device structure of the present disclosure.

In FIGS. 1 and 2, the casing 100 of this preferred embodiment is preferably a rectangular box made by bending a metal sheet, and the casing 100 includes a front panel 110 and a plurality of side panels 120, 130, 140, 150 perpendicularly coupled to the front panel 110. In this preferred embodiment, the casing 100 has four side panels 120, 130, 140, 150, but the number of side panels of the present disclosure is not limited, and the side panel 130 is shown in FIG. 5). The front panel 110 has an insertion port 111, wherein the side panel 120 has two through holes 121. The insertion port 111 is provided for plugging the plug 11.

The elastic plate 200 is contained in the casing 100 and attached onto an internal side of the casing 100. In this preferred embodiment, the elastic plate 200 is preferably formed by bending a metal strip, and both ends of the elastic plate 200 are a fixed end 210 and a movable end 220 respectively. In this preferred embodiment, the fixed end 210 is fixed to an internal side of the side panel 120, so that the elastic plate 200 is attached onto the side panel 120, and the movable end 220 is extended and protruded from the front panel 110 and aligned evenly with an edge 112 of the insertion port 111. The elastic plate 200 (at the fixed end 210) has two hooks 230 protruded from the edge of the elastic plate 200, and each hook 230 is extended and passed through each corresponding through hole 121 of the side panel 120 and protruded from the external side of the casing 100. When the power supply device is installed in the cabinet 20, each hook 230 is latched into the latch hole 21 formed on an inner wall of the cabinet 20 (See FIG. 5) to prevent the power supply device from falling out from the cabinet 20.

The pull handle 300 includes a crank lever 310 and a connecting element 320. In this preferred embodiment, the crank lever 310 is preferably an L-shaped crank lever made of metal, and the end of the shorter section of the crank lever 310 is pivoted to the casing 100 by a first pivot 410, preferably pivoted to the front panel 110 of the casing 100 in this preferred embodiment. However, the disclosure is not limited to such arrangement only. For example, the crank lever 310 may be pivoted to another side panel 130 which is perpendicularly coupled to the front panel 110. An end of the longer section of the crank lever 310 is pivoted to an end of the connecting element 320 by a third pivot 430, and a portion of the longer section of the crank lever 310 is bent into a U-shaped clamp portion 311. The other end of the connecting element 320 is pivoted to the movable end 220 of the elastic plate 200 by a second pivot 420.

Figure 4:
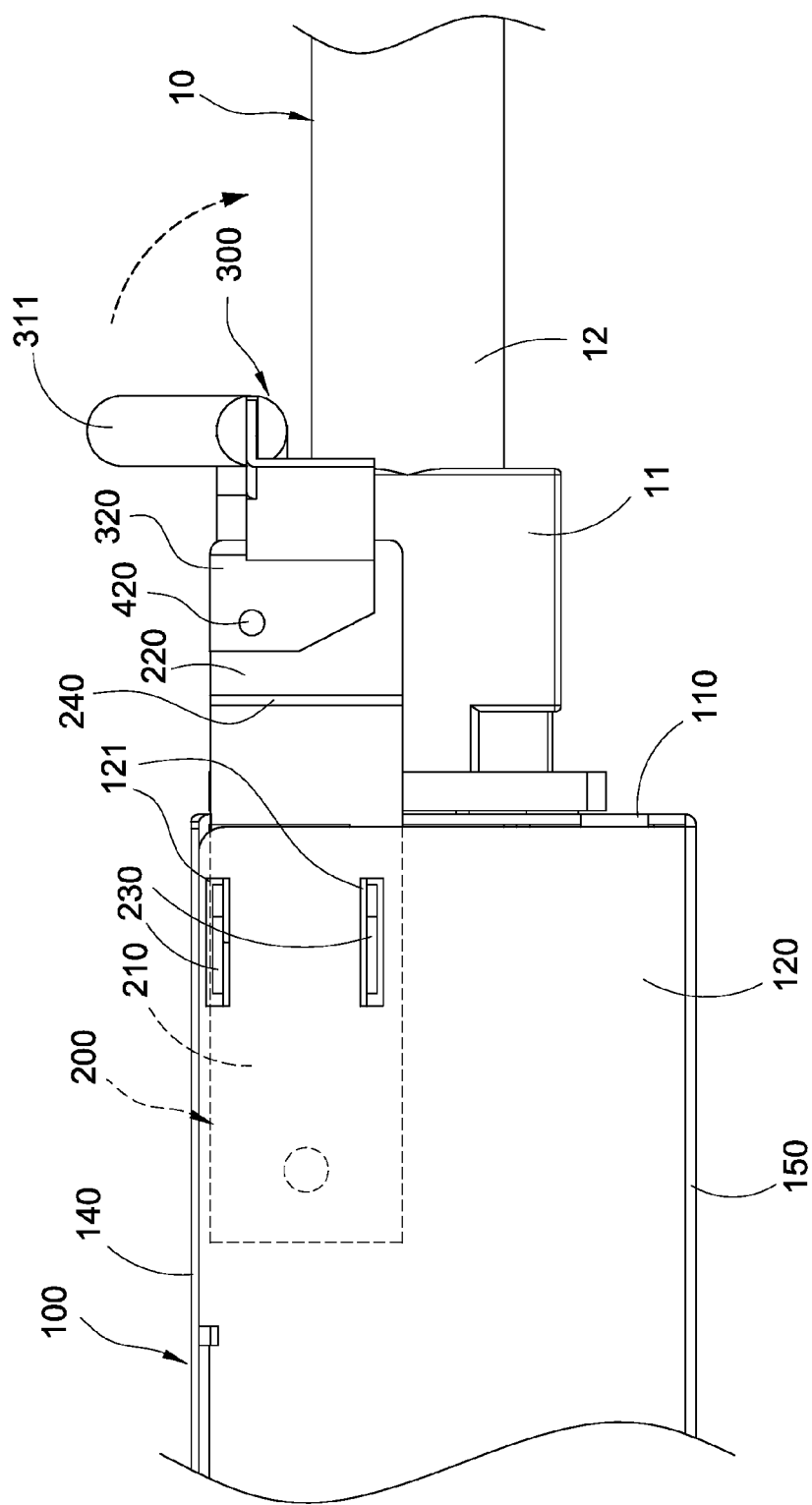
FIG. 4 is a schematic view of a power supply device structure of the present disclosure situated at a releasing position.
Figure 6:
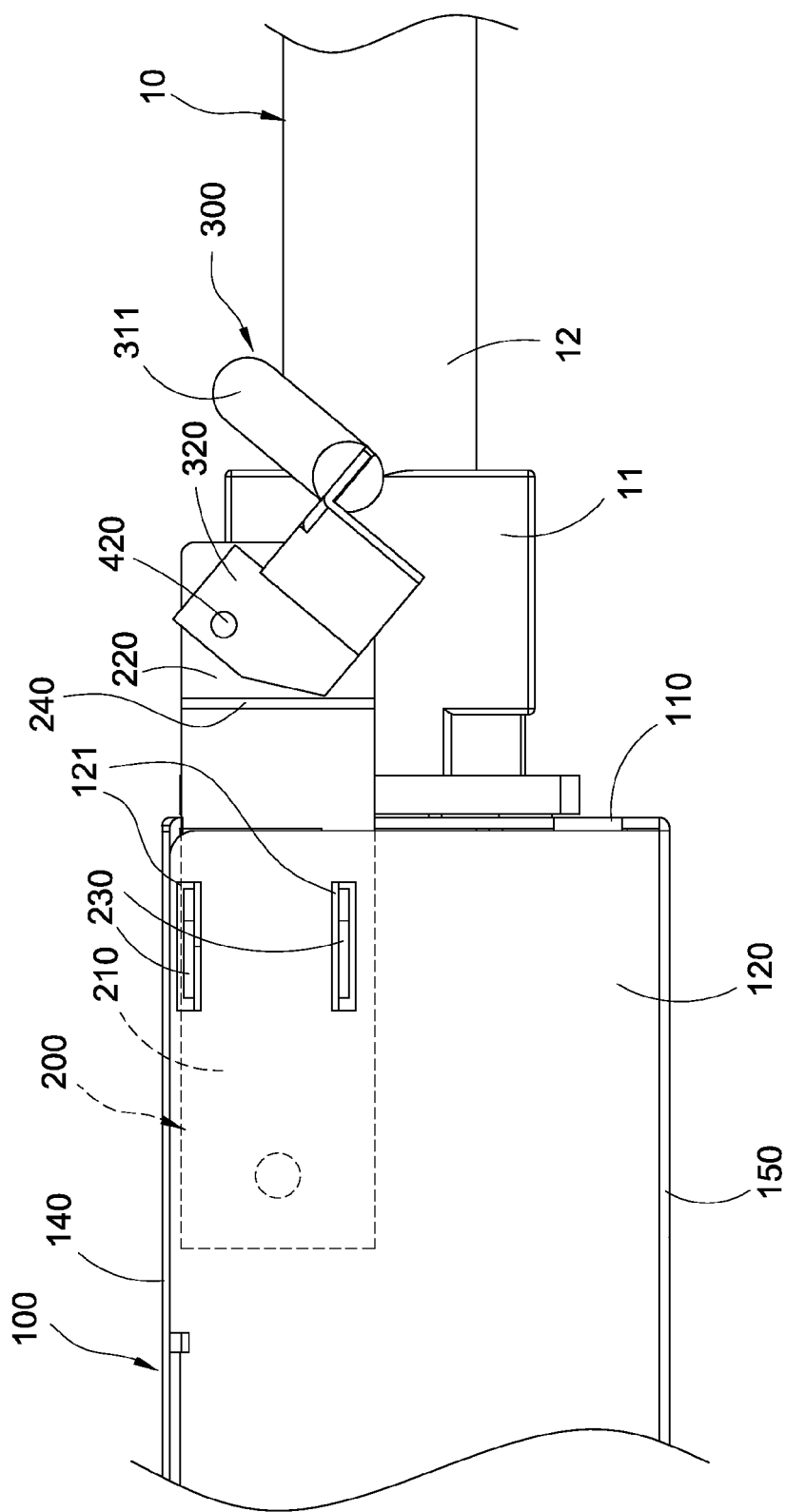
FIG. 6 is a schematic view of a power supply device structure of the present disclosure situated at a locking.

In FIGS. 1, 2 and 4, the clamp portion 311 is disposed at a position corresponding to the insertion port 111, and the pull handle 300 is pivoted by the first pivot 410 and the second pivot 420 and situated between a releasing position (as shown in FIG. 4) and a locking position (as shown in FIG. 6). When the pull handle 300 is situated at the releasing position, the position of the clamp portion 311 is higher than the position of the insertion port 111, so that the plug 11 may pass the clamp portion 311 and insert into the insertion port 111.

In FIG. 5, the power supply device of the present disclosure is installed in a cabinet 20, and two hooks 230 of the present disclosure are latched into a latch hole 21 formed on the cabinet 20 for fixing in the cabinet 20. When the movable end 220 of the elastic plate 200 is pushed towards the insertion port 111 and separated from the side panel 120, the two hooks 230 of the elastic plate 200 are driven away from the through hole 121 and retracted towards the interior of the casing 100 so as to withdraw from the latch hole 21 for releasing the power supply device from the cabinet 20. Now, the crank lever 310 is provided for users to hold in order to pull the power supply device out from the cabinet 20. Meanwhile, the connecting element 320 is driven by the movable end 220 of the elastic plate 200 and turned towards the crank lever 310 by using the third pivot 430 as a pivot. The connecting element 320 is pivoted, so that the movable end 220 of the elastic plate 200 and the crank lever 310 may be operated separately.

In FIGS. 3 and 6, when the plug 11 of the electric cable 10 is inserted into the insertion port 111, and the pull handle 300 is pivoted to the locking position along the first pivot 410 and the second pivot 420 with respect to the front panel 110, the clamp portion 311 is situated at the front of the insertion port 111, and the clamp portion 311 is preferably situated across the conductive wire 12 and blocks an external side of the plug 11, so that the plug 11 can be clamped to prevent the plug 11 from falling out from the insertion port 111.

In FIG. 7, the movable end 220 of the elastic plate 200 is aligned evenly with an edge 112 of the insertion port 111, so that when the plug 11 is plugged into the insertion port 111, the elastic plate 200 is blocked by the plug 11 and cannot be pushed towards the insertion port 111.

In FIGS. 1 and 6, the elastic plate 200 of this preferred embodiment selectively has a stop portion 240 which may be abutted by the connecting element 320 to limit the pivoting of the pull handle 300, and the stop portion 240 is preferably for limiting the pull handle 300 to a locking position for restricting the pivoting of the pull handle 300 when the pull handle 300 is pivoted. The stop portion 240 of the elastic plate 200 can stop the connecting element 320 and limit the pivoting of the pull handle 300. When the pull handle 300 is situated at the locking position, the stop portion 240 can prevent the clamp portion 311 from pressing the conductive wire 12. In FIGS. 1, 3 and 7, the pull handle 300 selectively has a stop portion 312 disposed adjacent to the first pivot 410 and provided for being abutted by the crank lever 310 to limit the locking position. When the pull handle 300 is situated at the locking position, the stop portion 312 can block the crank lever 310 to prevent the conductive wire 12 be pressed by the clamp portion 311.

While the disclosure has been described by means of specific embodiments, numerous modifications and variations could be made thereto by those skilled in the art without departing from the scope and spirit of the disclosure set forth in the claims.

What is claimed is:

1. A power supply device structure, comprising:
   a casing, including a front panel, and an insertion port formed on the front panel;
   an elastic plate, installed on an internal side of the casing, and both ends of the elastic plate being a fixed end and a movable end respectively, and the fixed end being disposed on the internal side of the casing, and the movable end being protruded from the front panel ; and
   a pull handle, with an end being pivoted to the casing by a first pivot, and the other end of the pull handle being pivoted to the movable end of the elastic plate by a second pivot, and a portion of the pull handle being bent into a U-shaped clamp portion;
   wherein the clamp portion is disposed at a position corresponding to the insertion port, and the pull handle is pivoted by the first pivot and the second pivot, so that the clamp portion is situated at an external side of the insertion port.

2. The power supply device structure of claim 1, wherein the pull handle includes a crank lever and a connecting element, and an end of the crank lever is pivoted to the front panel by the first pivot, and the other end of the crank lever is pivoted to an end of the connecting element by a third pivot, and the other end of the connecting element is pivoted to the elastic plate by the second pivot.

3. The power supply device structure of claim 2, wherein the clamp portion is formed on the crank lever.

4. The power supply device structure of claim 2, wherein when the movable end of the elastic plate is pushed away from the casing, the connecting element is driven by the movable end of the elastic plate and turned towards the crank lever by using the third pivot as a pivot.

5. The power supply device structure of claim 3, wherein when the movable end of the elastic plate is pushed away from the casing, the connecting element is driven by the movable end of the elastic plate and turned towards the crank lever by using the third pivot as a pivot.

6. The power supply device structure of claim 1, wherein the casing includes a side panel perpendicularly coupled to the front panel, and the fixed end of the elastic plate has a hook, and the elastic plate is installed to the side panel by the hook.

7. The power supply device structure of claim 6, wherein the side panel has a through hole formed thereon, and the hook of the elastic plate is disposed in the through hole.

8. The power supply device structure of claim 6, wherein the pull handle is pivoted to the front panel by the first pivot or pivoted to another side panel which is perpendicularly coupled to the front panel.

9. The power supply device structure of claim 1, wherein the pull handle is pivoted to the front panel by the first pivot or pivoted to a side panel which is perpendicularly coupled to the front panel.

10. The power supply device structure of claim 1, wherein the fixed end of the elastic plate has a hook, and the casing has a through hole formed thereon, and the hook of the elastic plate is disposed in the through hole.

11. The power supply device structure of claim 7, wherein when the movable end of the elastic plate is pushed away from the casing, the hook is driven away from the through hole and retract towards the interior of the casing.

12. The power supply device structure of claim 10, wherein when the movable end of the elastic plate is pushed away from the casing, the hook is driven away from the through hole and retracted towards the interior of the casing.

13. The power supply device structure of claim 1, wherein the movable end is aligned evenly with an edge of the insertion port.

14. The power supply device structure of claim 1, wherein the pull handle is pivoted by the first pivot and the second pivot to situate between a releasing position and a locking position, and when the pull handle is situated at the locking position, the clamp portion is situated at the front of the insertion port, and when the pull handle is situated at the releasing position, the position of the clamp portion is higher than the position of the insertion port.

15. The power supply device structure of claim 14, wherein the pull handle has a stop portion disposed adjacent to the first pivot and abutted by the crank lever to limit the locking position.

16. The power supply device structure of claim 14, wherein the elastic plate further includes a stop portion which may be abutted by the connecting element to limit the locking position.

* * * * *